United States Patent [19]

Kim et al.

[11] Patent Number: 5,039,944

[45] Date of Patent: Aug. 13, 1991

[54] MAGNETOMETER BASED ON THE MAGNETICALLY MODULATED RESISTANCE OF A SUPERCONDUCTOR

[75] Inventors: Boris F. Kim, Pasadena; Joseph Bohandy, Columbia; Frank J. Adrian, Olney; Kishin Moorjani, Silver Spring, all of Md.

[73] Assignee: The Johns Hopkins University, Baltimore, Md.

[21] Appl. No.: 437,578

[22] Filed: Nov. 17, 1989

[51] Int. Cl.$^5$ ............... G01R 33/035; H01L 39/00
[52] U.S. Cl. ........................... 505/1; 324/248; 505/726; 505/727; 505/782; 505/845
[58] Field of Search ............ 324/248; 505/1, 726, 505/727, 843, 845, 782

[56] References Cited

U.S. PATENT DOCUMENTS

| | | | |
|---|---|---|---|
| 4,851,762 | 7/1989 | Kim et al. | 324/71.6 |
| 4,904,929 | 2/1990 | Bohandy et al. | 324/71.6 |
| 4,906,607 | 3/1990 | Tyagi | 324/248 X |

Primary Examiner—Gerard R. Strecker
Attorney, Agent, or Firm—Robert E. Archibald; Mary Louise Beall

[57] ABSTRACT

The invention relates to an apparatus and method to detect a magnetic field by measuring the magnetically modulated resistance of a superconductor maintained at its phase transition temperature ($T_c$).

23 Claims, 6 Drawing Sheets

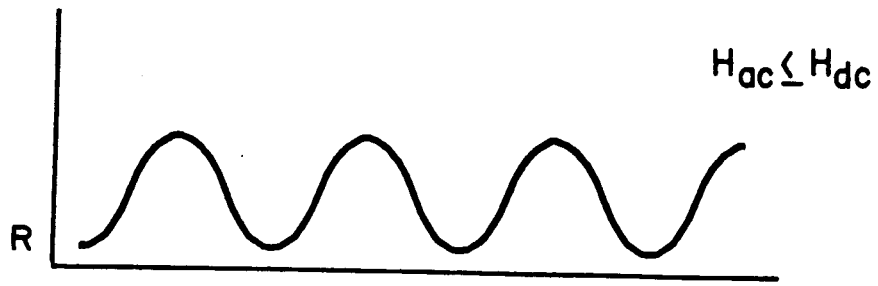
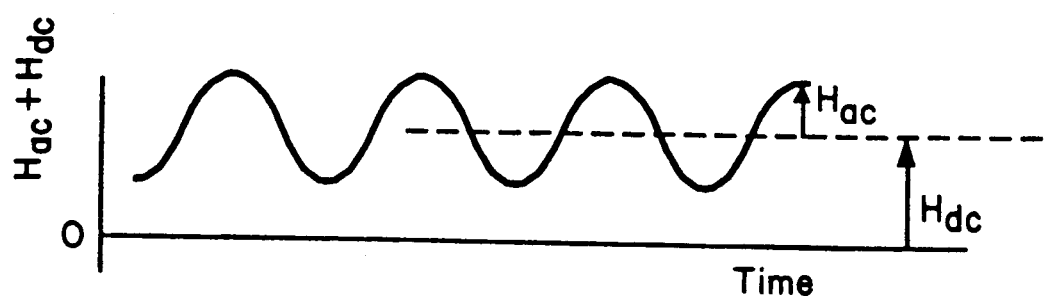
FIG.3a
FIG.3b
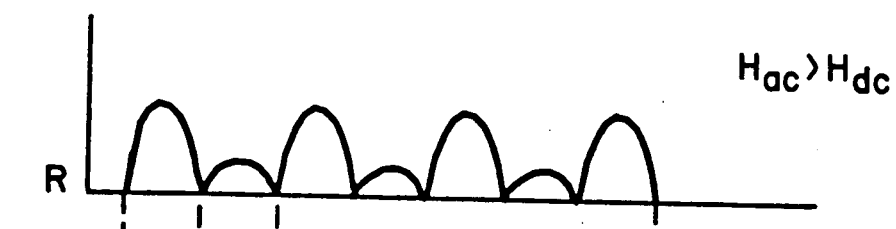
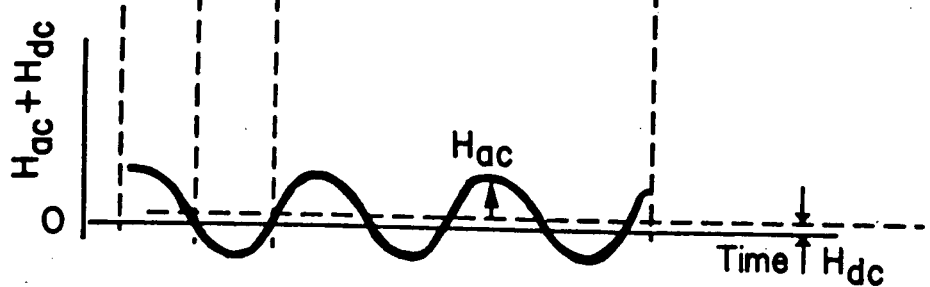
FIG.4a
FIG.4b

MAGNETOMETER BASED ON THE MAGNETICALLY MODULATED RESISTANCE OF A SUPERCONDUCTOR

STATEMENT OF GOVERNMENTAL INTEREST

The Government has rights in this invention pursuant to Contract No. N00039-89-C-5301 awarded by the Department of the Navy.

BACKGROUND OF THE INVENTION

This invention relates to an apparatus and method to detect a magnetic field. The apparatus used in the method of the present invention is generally described in commonly assigned U.S. Pat. No. 4,851,762 made by the same inventors and entitled "A Novel Technique Using Magnetic Field Dependent Phase Detection for Detection of Superconductivity" and incorporated herein by reference. This patent teaches that the phase transition temperature ($T_c$) of a superconductor may be determined using a magnetically modulated resistance measurement. Any type of resistance device may be used.

A related commonly assigned patent application is Ser. No. 07/325,823 entitled "A Method for Detection of Weak Links in the Current Path of Electrically Continuous Superconductors" filed Mar. 30, 1989, U.S. Pat. No. 4,904,929. This method also uses a magnetically modulated resistance measurement but is limited to measuring the dc or ac resistance.

OBJECTS OF THE INVENTION

It is an object of the present invention to provide an apparatus and method for the detection of magnetic fields.

It is also an object of the invention to create a magnetometer incorporating a superconductor.

It is also an object of the invention to provide a use for superconductors known to contain weak links.

It is another object of the invention to provide an apparatus and method to detect low magnetic fields.

Another object of the invention is to provide an apparatus and method to detect high magnetic fields.

Still another object of the invention is to utilize the properties of superconductors to detect magnetic fields.

BRIEF DESCRIPTION OF THE DRAWINGS

FIGS. 3a and 3b represent the time variation of the resistance compared with the time variation of H where $H_{dc} > H_{ac}$.

FIG. 4a and 4b represents the time variation of the resistance compared with the time variation of H where $H_{dc} < H_{ac}$.

SUMMARY OF THE INVENTION

The invention relates to an apparatus and a method to detect magnetic fields by measuring the electrical resistance of a superconductor. It is based on three principles:

1. At the superconductor phase transition temperature ($T_c$), the resistance of the sample precipitously goes to zero.
2. The superconductor phase transition temperature is magnetic field dependent.
3. At temperatures below the superconductor phase transition temperature, the resistance of any weak links present in the superconductor is very magnetic field dependent.

The three principles combine to demonstrate that, at and below $T_c$, the resistance of a superconductor increases with the absolute value of the external magnetic field. The invention, based on this superconductor property, provides an apparatus and method able to accurately and rapidly detect the presence of a magnetic field.

As disclosed in U.S. Pat. No. 4,851,762, mentioned above, the superconductive phase transition temperature ($T_c$) can be detected by measuring the magnetically modulated resistance response, a method based on the first two principles. U.S. Ser. No. 07/325,823, mentioned above, also teaches a method to detect weak links in a superconductor by measuring the magnetically modulated resistance at temperatures below $T_c$. This method is disclosed as being limited to measuring the magnetically modulated electrical resistance, but recent work has demonstrated that any resistance measurement may be used, including microwave absorption.

Figure 1A:
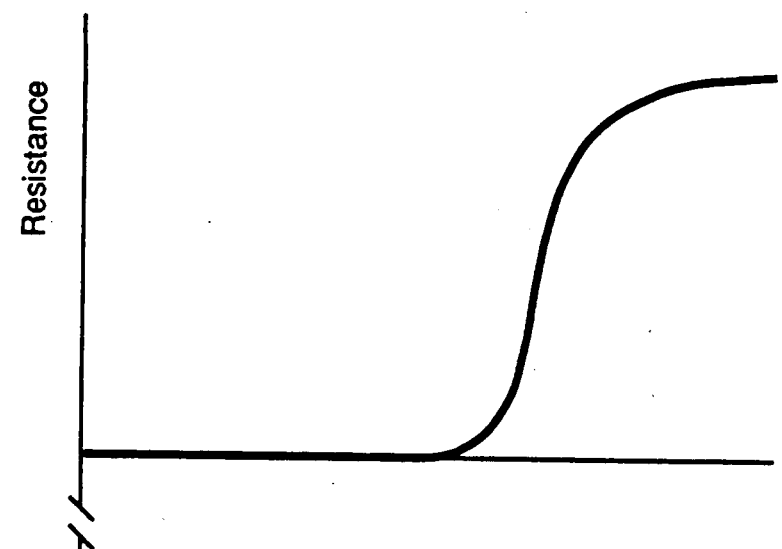
FIGS. 1a-1c represent several resistance properties of superconductors.
Figure 1B:
Figure 1C:
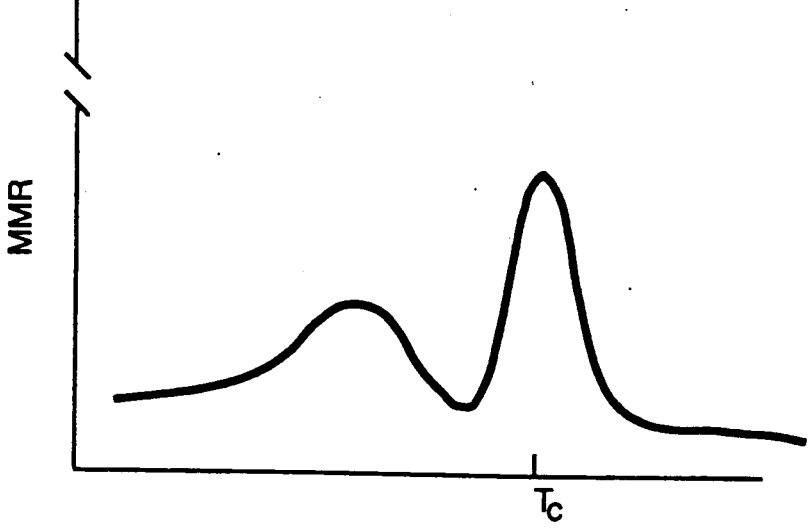

FIG. 1 demonstrates some properties of magnetically modulated resistance (MMR) techniques using superconductors. FIG. 1a shows a typical resistance vs. temperature curve for superconductors, while FIG. 1b shows the corresponding MMR curve. The peak response at $T_c$ in the MMR curve, is the characteristic signature for the intrinsic superconducting phase transition. The peak is proportional to the derivative of the unmodulated resistance curve (FIG. 1a) in the region of the abrupt drop in resistance at $T_c$. In addition to the MMR peak at $T_c$, occasional features occur at $T < T_c$ as illustrated in FIG. 1c. These secondary peaks, which can be quite broad, have their origin in weak links that often occur in granular samples.

In the present invention, the magnetically modulated resistance response of a superconductor is phase detected and recorded while the temperature of the superconductor is maintained at a preselected temperature. This temperature is either the $T_c$ of the superconductor or the temperature of a weak link peak in the MMR response, if one exists, and must be determined experimentally. The output signal is expressed as a voltage determined according to the equation:

$$Voltage = Resistance \times Current \ (V = RI). \tag{1}$$

Figure 2:
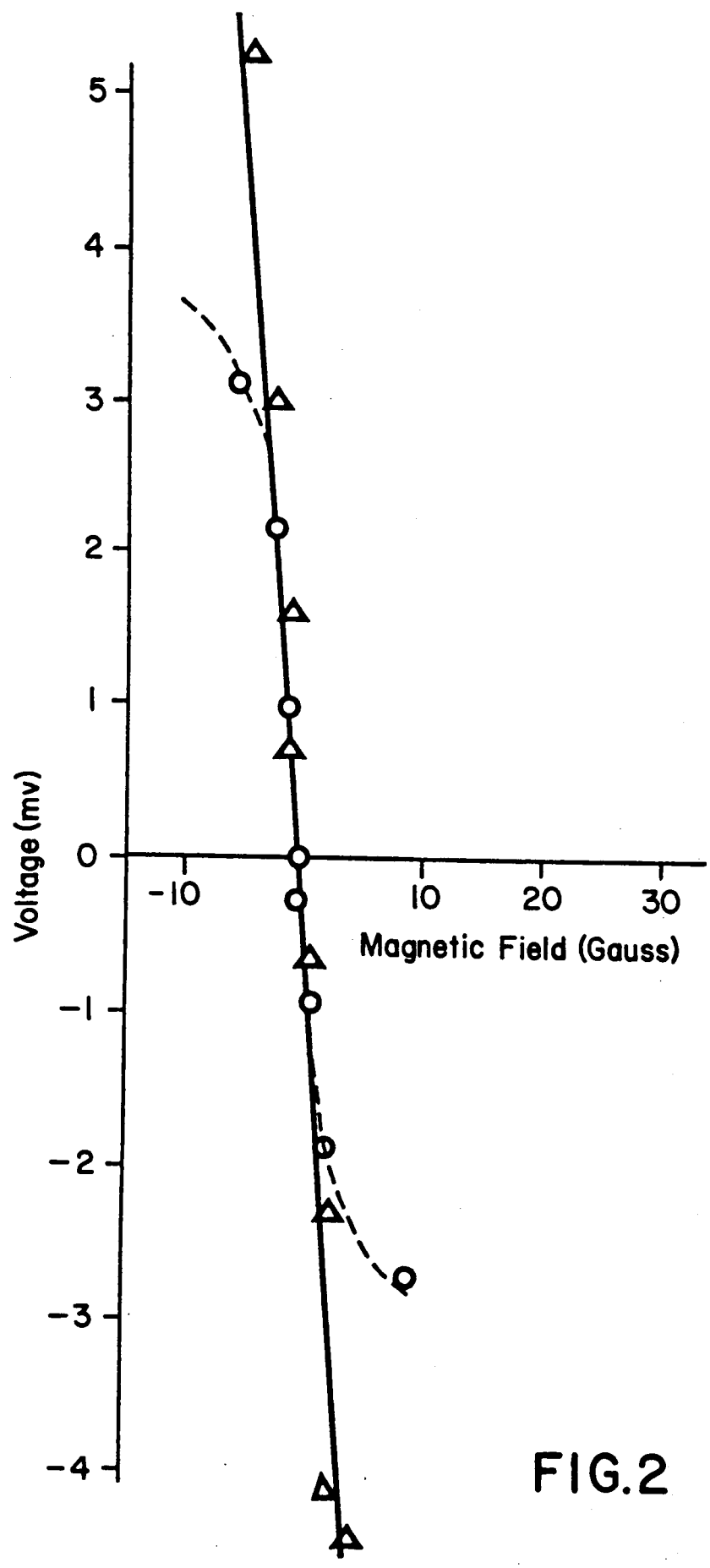
FIG. 2 represents the relationship between magnetically modulated resistance and dc magnetic field.

FIG. 2 presents experimental results demonstrating the relationship between the dc magnetic field expressed in Gauss and the resistance expressed as a voltage according to (1) above. The magnetometer was operated at 80° K. and at two different modulation amplitudes ($H_{ac}$): curve Δ, $H_{ac} = 5$ Gauss and curve 0, $H_{ac} = 2$ Gauss. Note that at zero magnetic field, the magnetometer response is zero.

According to the invention, the resistance of a known superconductor at or slightly below its $T_c$ is measured in the presence of a modulating ac magnetic field ($H_{ac}$). When the temperature of a known superconductor is maintained at its $T_c$, the application of a magnetic field causes its resistance to increase and its $T_c$ to decrease. If a dc magnetic field is present, it is modulated by the applied ac magnetic field causing the resistance of the superconductor to fluctuate at the modulating frequency. The resistance is measured continuously and the magnetically modulated response is phase detected at the modulating frequency.

If the magnetometer detects the presence of $H_{dc}$, it produces an output signal. If there is no $H_{dc}$, no signal is produced.

In a similar fashion, the invention may be practiced by maintaining the temperature of the superconductor at the temperature of a known weak link peak, similar to the secondary peak shown in FIG. 1c. According to the third principle mentioned above, the resistance in weak links is very magnetic field dependent. Thus, when the temperature of a known superconductor is maintained at the known weak link peak temperature, the application of a magnetic field ($H_{dc}$) causes the weak link resistance of the superconductor to increase. If this same field is modulated by the application of ac magnetic field ($H_{ac}$), the resistance will fluctuate at the modulating frequency and the phase detected result will be as above.

As discussed above, the present invention is based upon the property of superconductors that their resistance is a function of the absolute value of an applied magnetic field, $H_{dc} + H_{ac}$. If $H_{dc} \geq H_{ac}$, the sinusoidal time variation in the phase detected resistance (FIG. 3b) is the same as that of the applied ac magnetic field ($H_{ac}$) as shown in FIG. 3a. In the case where $H_{dc} < H_{ac}$, then because the resistance is a function of the absolute value of the magnetic field, the phase detected resistance (4b) will not have a pure sinusoidal variation as does $H_{ac}$ but will have the time dependence as shown in FIG. 4a. However, FIG. 4 demonstrates that when $0 < H_{dc} < < H_{ac}$, some component of the pure sinusoidal time dependence of resistance due to $H_{ac}$ remains. Using Fourier analysis, it can be shown that when $H_{dc} << H_{ac}$, the output signal is proportional to the strength of $H_{dc}$.

Mathematically, the invention may be characterized in the following discussion wherein $H_m$ represents the ac magnetic field, $H_{ac}$, and $H_o$ represents the component of the dc magnetic field $H_{dc}$ colinear with $H_{ac}$.

The resistance of a superconductor in a small magnetic field $\delta H$ is:

$$R(\delta H) = R(0) + (\partial R/\partial H)_0 |\delta H| \qquad (2)$$

where the absolute value of $\delta H$ is written to emphasize the dependence only on the magnitude of this vector quantity. It is to be noted that $R(0)$ and $(\partial R/\partial H)_0$ are functions of the temperature. $(\partial R/\partial H)_0$ is always positive and independent of the orientation of $\delta H$ except for anisotropic superconductors. Large anisotropy is the norm for a single crystal or oriented film of the oxide superconductors but is readily taken into account in practice using the measured anisotropy of the superconductor. If the field consists of a small dc component and a colinear ac component, i.e., $$\delta H = H_0 + H_m \sin \omega t, \qquad (3)$$

where $H_0 << H_m$ then from (2) R is $$R = R(0) + (\partial R/\partial H)_0 |H_0 + H_m \sin \omega t|. \qquad (4)$$

The component of resistance $R(\omega)$, which has a sinusoidal time dependence with frequency $\omega$ is, from Fourier analysis of (4), $$R(\omega) = (\partial R/\partial H)_0 (4H_0/\pi) \sin \omega t, H_0 </21 H_m, \qquad (5)$$

and contains the physical basis for the magnetometer concept. Because $H_m$ and $H_o$ are colinear, this is a vector magnetometer. To measure the total magnetic field comprising three orthogonal vector components, three magnetometers in orthogonal array are required. For small dc magnetic fields the resistance component, $R(\omega)$, is directly proportional to the magnitude of the dc field in the direction of the modulation field, and is independent of the amplitude of the modulation field. If the superconducting element is anisotropic, $R(\omega)$ will depend on the orientation of $H_m$ with respect to the superconductor. However, this presents no problem as the apparatus can always be configured with $H_m$ oriented so as to maximize $(\partial R/\partial H)_0$.

Any superconductor may be used. Some examples are Bi-Sr-Ca-Cu-O, NbN and $Y_1Ba_2Cu_3O_{7-x}$. A main benefit provided by the present invention is that the superconductor need not be pure or of high quality. In many of the granular superconductors studied by the magnetically modulated resistance methods discussed above, the weak link response with its secondary peak(s) predominates over the intrinsic response.

Any type of resistance measurement system or device may be used. However, in practice, the resistance is measured by either a magnetically modulated microwave absorption (MAMMA) method or by a magnetically modulated electrical resistance (MAMER) method. A typical electrical resistance measuring device uses the four point probe technique.

The ac modulation magnetic field is in the approximate range of 0.1 to 50 Gauss. The ac modulation frequency is in the range of 1 Hertz to 100 KiloHertz.

There are some advantages to using microwave absorption because discontinuous (powder) superconductors may be used. On the other hand, configurations based upon dc or ac resistances are more simple and smaller to package for use in space or aircraft.

Figure 7:
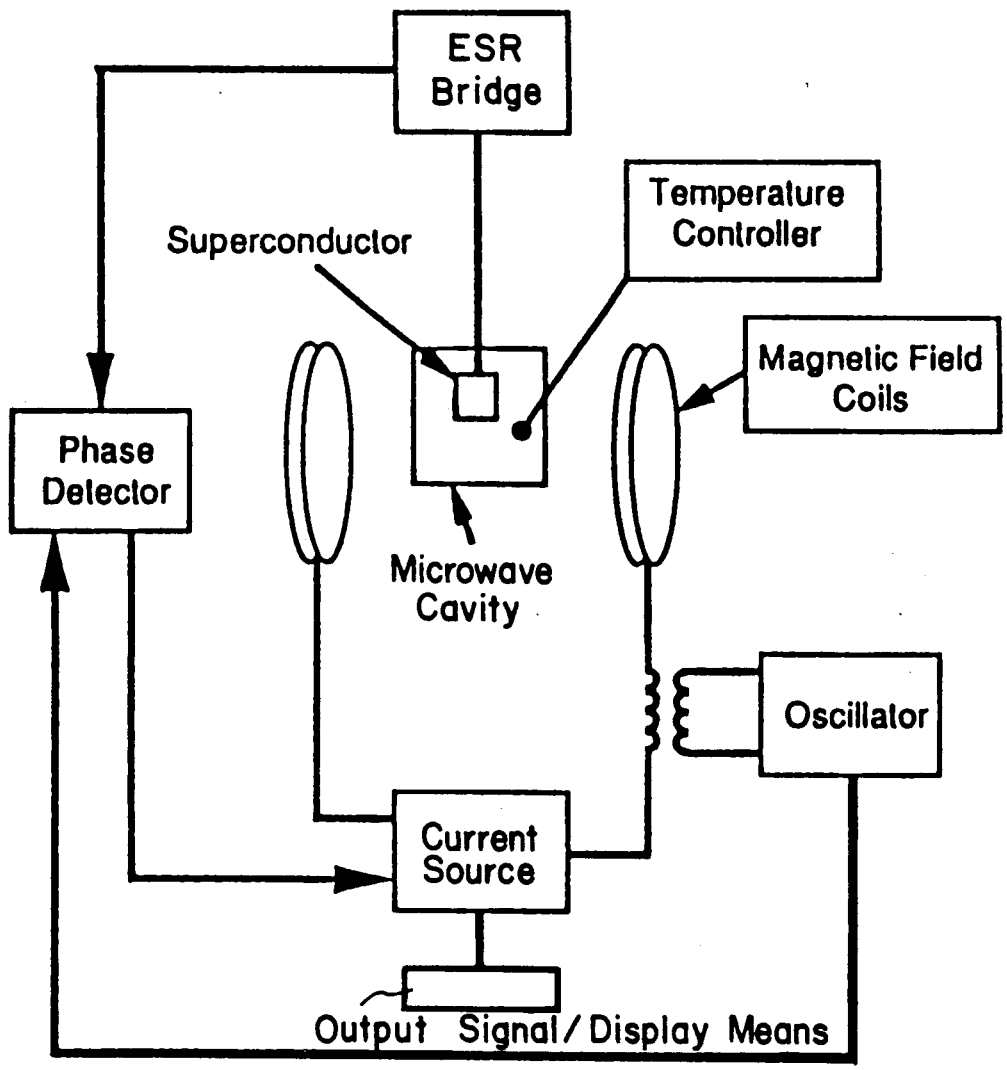
FIG. 7 is a block diagram of an enhanced embodiment of FIG. 5.

In cases where $H_{dc} > H_{ac}$, it is necessary to configure the system using feed back from the output to bring the magnetic field at the superconductor into the range $0 \leq H_{dc} << H_{ac}$. In practice it is most convenient to null the field at the superconductor. A block diagram of this type of apparatus is shown in FIG. 7, including feedback means between the output signal and a current source. The current source is used to impose the appropriate magnetic field on the superconductor by way of the magnetic field coils.

DESCRIPTION OF THE PREFERRED EMBODIMENT

Figure 5:
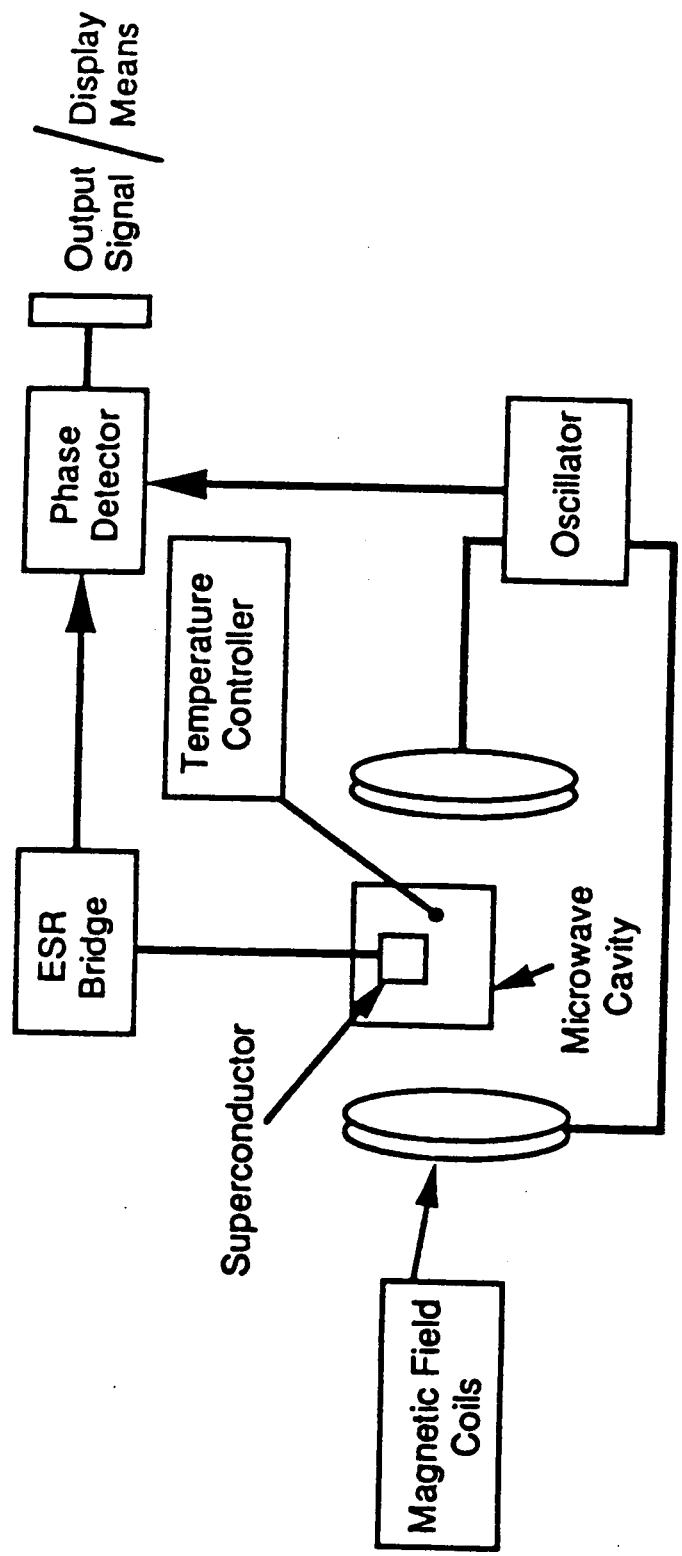
FIG. 5 is a block diagram of the particular embodiment of the present invention.

A preferred apparatus for detecting and measuring magnetic fields smaller than $H_{ac}$ is represented in FIG. 5. This is a microwave absorption apparatus and consists of an electron spin resonance (ESR) bridge, a temperature controller, magnetic field coils for impressing an ac modulation field upon the superconductor within the microwave cavity and a phase detector detecting the microwave signal reflected from the cavity. The phase detector detects signals which are phase coherent with the magnetic field modulation, $H_{ac}$. When the magnetometer is operated in the neighborhood of $T_c$, the output of the phase detector is directly proportional to the magnetic field imposed on the superconductor if $H_{dc}/H_{ac}<<1$.

The preferred embodiment uses a known superconductor, for example Bi-Sr-Ca-Cu-O, in a microwave resonant cavity and measures the microwave resistance of the superconductor. While the temperature of the superconductor is maintained at $T_c$, microwave energy is imposed on the superconductor via the ESR bridge provided with a microwave detector. The frequency of the microwave energy is locked to the resonant frequency of the cavity by standard automatic frequency control methods. The oscillator and the microwave detector in the ESR bridge are both connected to a phase detector which compares the microwave signal from the cavity to the signal from the oscillator.

An ac magnetic field, $H_{ac}$, in the range of 0.1-5 Gauss and modulated at a frequency of about 10 KiloHertz, is applied to the superconductor by the magnetic field coils using an ac frequency supplied by the oscillator. The temperature controller controls the temperature of the superconductor in the cavity. Any changes in microwave absorption, detected by the microwave detector are phase detected at the modulation frequency by the phase detector. As discussed above, when $H_{dc}<<H_{ac}$, the resistance based output signal is proportional to $H_{dc}$. When $H_{dc}=0$, there is no signal.

Figures 6A, 6B:
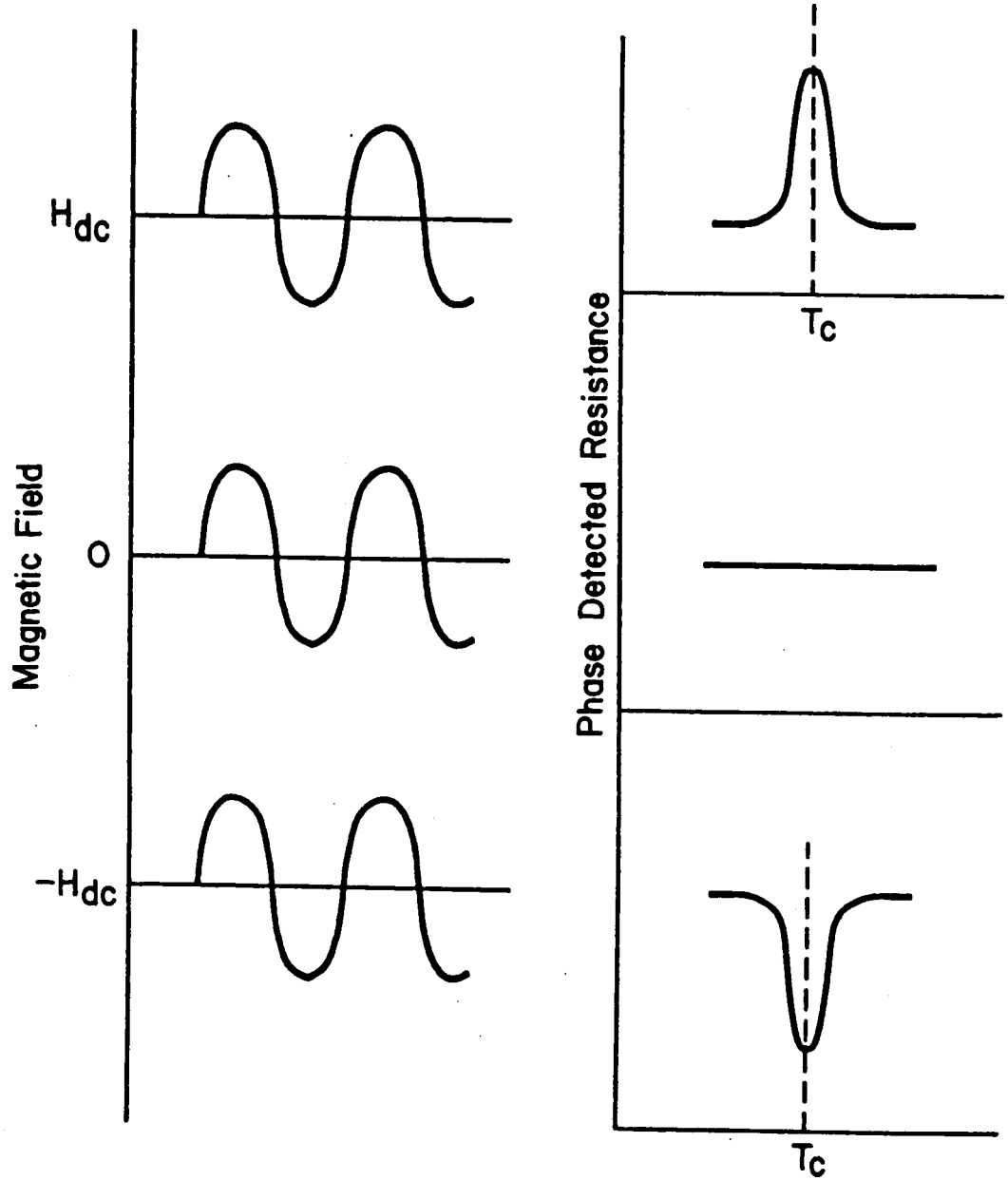
FIG. 6a represents phase detected resistance response compared to the sense of the detected dc magnetic field 6b.

The sense of the field is indicated by the polarity of the output of the phase detector. FIG. 6a shows a positive $H_{dc}$, a zero $H_{dc}$ and a negative $H_{dc}$ modulated by the application of $H_{ac}$. FIG. 6a shows the respective phase detected resistance curves. Note that in the operation of the preferred embodiment, the respective output signals would be positive, zero and negative. Note in FIG. 6 that when the magnetic field is zero, the response is zero.

The basic apparatus described above referring to FIG. 5 can be enhanced as indicated in FIG. 7 to allow measurements of magnetic fields which are larger than $H_{ac}$. This involves the use of the magnetic field coils to impose a dc field on the superconductor, the field having such a value as to bring the field at the superconductor into the range $0 \leq H_{dc}<<H_{ac}$. In practice, the magnetometer of FIG. 7 is usually operated as a null detector by using feedback from the output signal to zero the magnetic field at the superconductor. In this case, the value of the field produced by the coils is a direct measure of the magnitude and sense of the external field along the axis of the coils. When the FIG. 7 apparatus is not operated as a null detector, the value of the external magnetic field along the axis of the coils is equal to the value of the imposed field plus the magnetic field indicated by the output signal.

Note that the FIG. 7 system described above can also be used to measure small fields where $H_{dc}<H_{ac}$.

Computer means, not shown, are required to operate the process and apparatus of the invention.

The invention described is not intended to be limited to the embodiments disclosed but includes modifications made within the true spirit and scope of the invention.

We claim:

1. A method for detecting the presence of a dc magnetic field comprising:
    providing a resistance measuring device;
    providing a superconductor;
    maintaining the temperature of the superconductor at one of its known:
      a) superconductor phase transition temperature, and
      b) superconductor weak link peak temperature, while
    applying an ac magnetic field modulated at a known frequency to the superconductor while measuring the resistance of the superconductor with the resistance measuring device, by phase detection at said modulation frequency;
    wherein the presence of a dc magnetic field is detected by the presence of an output signal demonstrating changes in the resistance occurring at the known modulation frequency.

2. A method according to claim 1, wherein the resistance is measured by a microwave absorption method.

3. A method according to claim 1, wherein the resistance is measured by an electrical resistance method.

4. A method according to claim 1, including representing the resistance as an output signal expressed in voltage and determined in accordance to the equation $V=RI$.

5. A method according to claim 1, wherein the output signal is zero when there is no dc magnetic field present.

6. A method according to claim 2, wherein the superconductor is maintained at the known superconductor phase transition temperature.

7. A method according to claim 2, wherein the superconductor is maintained at the known weak link peak temperature.

8. A method according to claim 3, wherein the superconductor is maintained at the known superconductor phase transition temperature.

9. A method according to claim 3, wherein the superconductor is maintained at the known weak link peak temperature.

10. A method according to claim 1, wherein the applied ac magnetic field ($H_{ac}$) is greater than the dc magnetic field ($H_{dc}$) to be detected.

11. A method according to claim 10, wherein when $0 \leq H_{dc}<<H_{ac}$, the output signal is proportional to $H_{dc}$.

12. A method according to claim 1, and further comprising:
    imposing a dc magnetic field on the superconductor, said imposed dc magnetic field having such a value as to bring the dc field at the superconductor into the range $0 \leq H_{dc}<<H_{ac}$;
    wherein the value of the detected dc magnetic field is equal to the value of the imposed dc magnetic field plus the dc magnetic field indicated at the output signal.

13. A method according to claim 12, wherein the imposed dc magnetic field has such a value as to null the output signal and wherein the value of the detected dc magnetic field is equal to the value of the imposed dc magnetic field.

14. A method according to claim 4, wherein the sense of the detected dc magnetic field is indicated by the polarity of the output signal.

15. A method according to claim 1, wherein the applied ac magnetic field is in the range of 0.1 to 50 Gauss and is modulated at a frequency in the range of 1 Hertz to 100 KiloHertz.

16. An apparatus for detecting the presence of a dc magnetic field comprising:
    a superconductor;

a resistance measuring device measuring the resistance of the superconductor;

a temperature controller maintaining the temperature of the superconductor at one of its known:
  a) superconductor phase transition temperature, and
  b) superconductor weak link peak temperature;

means applying an ac magnetic field modulated at a known frequency to the superconductor;

a phase detector coupled to said resistance measuring device detecting changes in the resistance of the superconductor at the modulation frequency and producing an output signal;

means coupled to said phase detector displaying the output signal; and wherein the presence of a dc magnetic field is indicated by the output signal on said display means produced by changes in the resistance of the superconductor occurring at the known modulation frequency.

17. An apparatus according to claim 16, wherein the resistance measuring device is one of a microwave absorption device and an electrical resistance device.

18. An apparatus according to claim 16, including means displaying an output signal expressed in voltage and determined according to the equation $V = RI$.

19. An apparatus according to claim 16, including means using feedback from the output signal, imposing a dc magnetic field on said superconductor, said imposed field having a value such as to bring the dc field at the superconductor into the range $0 \leq H_{dc} << H_{ac}$.

20. An apparatus according to claim 19, wherein said imposed field has such a value as to null the output signal and wherein the value of the detected magnetic field is equal to the value of the imposed magnetic field.

21. A method according to claim 14, including displaying the output signal on display means, wherein the presence of a dc magnetic field is indicated by a peak in a curve formed by the output signal on the display means, and further wherein positive fields and negative fields produce peaks in opposite directions respectively.

22. An apparatus according to claim 16, wherein the temperature controller maintains the temperature of the superconductor at the superconductor phase transition temperature.

23. An apparatus according to claim 16, wherein the resistance measuring device is an electrical resistance device.

* * * * *